(12) United States Patent
Singer et al.

(10) Patent No.: US 10,741,996 B2
(45) Date of Patent: Aug. 11, 2020

(54) SEMICONDUCTOR LASER AND SEMICONDUCTOR LASER ARRANGEMENT

(71) Applicant: OSRAM Opto Semiconductors GmbH, Regensburg (DE)

(72) Inventors: Frank Singer, Regenstauf (DE); Norwin Von Malm, Nittendorf (DE); Tilman Ruegheimer, Regensburg (DE); Thomas Kippes, Neumarkt (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/765,706

(22) PCT Filed: Sep. 29, 2016

(86) PCT No.: PCT/EP2016/073353
§ 371 (c)(1),
(2) Date: Apr. 3, 2018

(87) PCT Pub. No.: WO2017/060161
PCT Pub. Date: Apr. 13, 2017

(65) Prior Publication Data
US 2018/0301866 A1    Oct. 18, 2018

(30) Foreign Application Priority Data

Oct. 6, 2015 (DE) .......... 10 2015 116 968

(51) Int. Cl.
*H01S 5/00* (2006.01)
*H01S 5/024* (2006.01)
(Continued)

(52) U.S. Cl.
CPC .......... *H01S 5/02469* (2013.01); *H01S 5/024* (2013.01); *H01S 5/0224* (2013.01);
(Continued)

(58) Field of Classification Search
CPC .............. H01S 5/0224; H01S 5/02272; H01S 5/02288; H01S 5/02469; H01S 5/0422;
(Continued)

(56) References Cited

U.S. PATENT DOCUMENTS

2002/0196996 A1* 12/2002 Ray .................... H01S 5/02272
385/14
2003/0015134 A1    1/2003 Tungare et al.
(Continued)

FOREIGN PATENT DOCUMENTS

CN      102097746 A     6/2011
JP      H05-160521 A    6/1993
(Continued)

OTHER PUBLICATIONS

Blue Laser Diode 1.6. W in TO56 Package, PL TB450B Preliminary www.osram-os.com Jun. 12, 2013.
(Continued)

*Primary Examiner* — Kinam Park
(74) *Attorney, Agent, or Firm* — Viering, Jentschura & Partner mbB

(57) ABSTRACT

In one embodiment of the invention, the semiconductor laser (1) comprises a semiconductor layer sequence (2). The semiconductor layer sequence (2) contains an n-type region (23), a p-type region (21) and an active zone (22) lying between the two. A laser beam is produced in a resonator path (3). The resonator path (3) is aligned parallel to the active zone (22). In addition, the semiconductor laser (1) contains an electrical p-contact (41) and an electrical n-contact (43) each of which is located on the associated region (21, 23) of the semiconductor layer sequence (2) and is configured to input current directly into the associated region (21, 23). A p-contact surface (61) is electrically connected to the p-contact (41), and an n-contact surface
(Continued)

Figure 3:
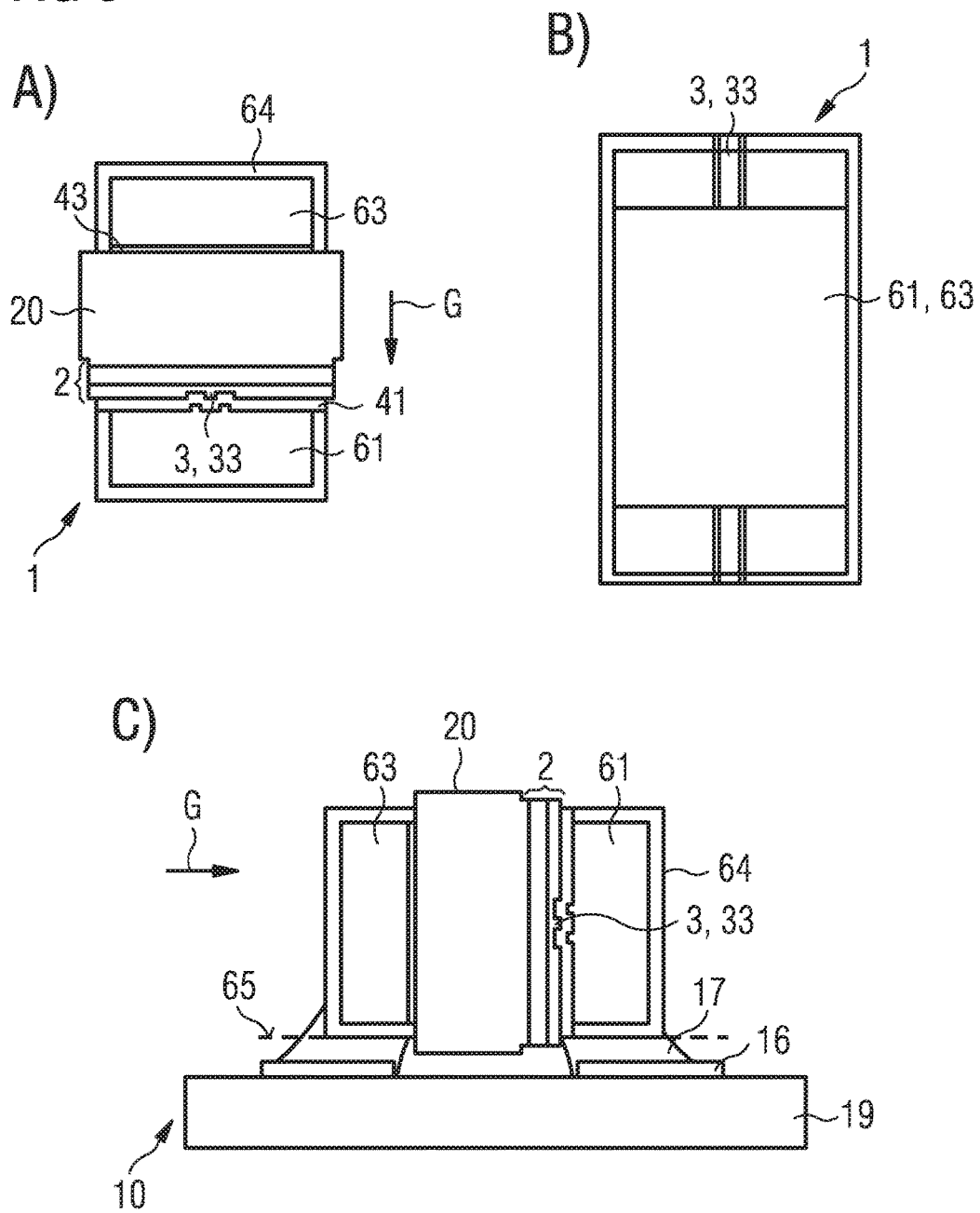

(63) is electrically connected to the n-contact (43) such that the p-contact surface (61) and the n-contact surface (63) are configured for external electrical and mechanical connection of the semiconductor laser (1). The contact surfaces (61, 63) are oriented parallel to a growth direction (G) of the semiconductor layer sequence (2). The semiconductor laser (1) can be surface-mounted without wires.

16 Claims, 11 Drawing Sheets

(51) Int. Cl.
| | |
|---|---|
| H01S 5/343 | (2006.01) |
| H01S 5/022 | (2006.01) |
| H01S 5/042 | (2006.01) |
| H01S 5/22 | (2006.01) |
| H01S 5/40 | (2006.01) |
| H01S 5/02 | (2006.01) |

(52) U.S. Cl.
CPC ...... *H01S 5/02228* (2013.01); *H01S 5/02272* (2013.01); *H01S 5/02276* (2013.01); *H01S 5/02288* (2013.01); *H01S 5/0422* (2013.01); *H01S 5/0425* (2013.01); *H01S 5/22* (2013.01); *H01S 5/343* (2013.01); *H01S 5/34313* (2013.01); *H01S 5/34326* (2013.01); *H01S 5/34333* (2013.01); *H01S 5/4025* (2013.01); *H01L 2224/48091* (2013.01); *H01L 2224/48465* (2013.01); *H01L 2224/49107* (2013.01); *H01S 5/0201* (2013.01); *H01S 5/02236* (2013.01); *H01S 2301/176* (2013.01)

(58) Field of Classification Search
CPC ...... H01S 5/0435; H01S 5/22; H01S 5/34313; H01S 5/34326; H01S 5/34333; H01S 5/4025; H01S 5/02236; H01S 5/024; H01S 5/343

See application file for complete search history.

(56) References Cited

U.S. PATENT DOCUMENTS

| | | | |
|---|---|---|---|
| 2006/0138444 A1 | 6/2006 | Chio et al. | |
| 2007/0286252 A1 | 12/2007 | Ha et al. | |
| 2009/0127573 A1* | 5/2009 | Guenther | ................ H01L 24/24 |
| | | | 257/98 |
| 2009/0238227 A1 | 9/2009 | Kubota et al. | |
| 2010/0078804 A1 | 4/2010 | Grusby | |
| 2011/0142089 A1 | 6/2011 | Kudo | |
| 2013/0256740 A1 | 10/2013 | Ahlstedt et al. | |
| 2013/0330033 A1 | 12/2013 | Yu et al. | |
| 2014/0160745 A1* | 6/2014 | Mandelboum | ..... G02B 27/0938 |
| | | | 362/235 |
| 2014/0227811 A1 | 8/2014 | Gebuhr et al. | |
| 2014/0327029 A1 | 11/2014 | Desamber | |

FOREIGN PATENT DOCUMENTS

| | | |
|---|---|---|
| JP | H11-274634 A | 10/1999 |
| JP | 2001-251018 A | 9/2001 |

OTHER PUBLICATIONS

OSRAM PLPM4 450 broschre-multi-die-laserpackage-gb www.osram-os.com Accessed Feb. 21, 2018.
Chinese Office Action based on Application No. 201680058370.8, dated Jun. 27, 2019 (7 pages) (for reference purpose only).

\* cited by examiner

FIG 1
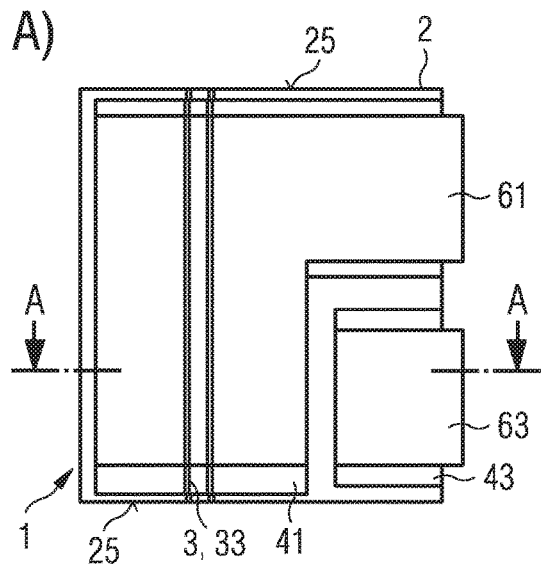
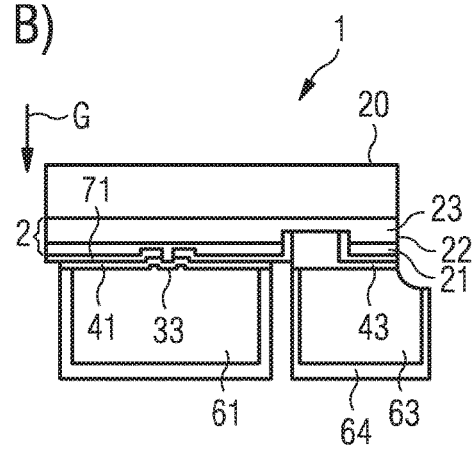
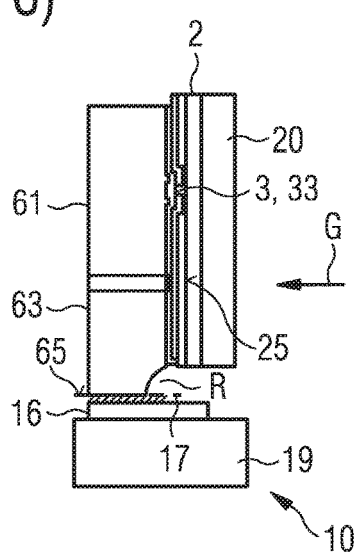
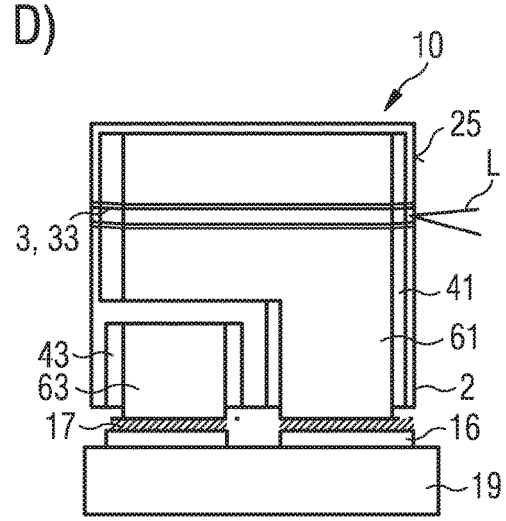

FIG 2
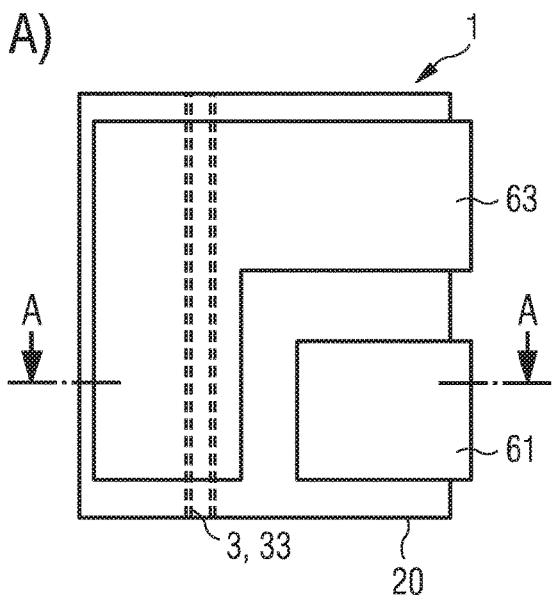
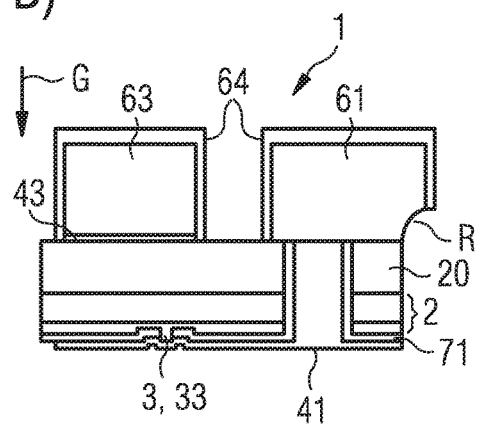
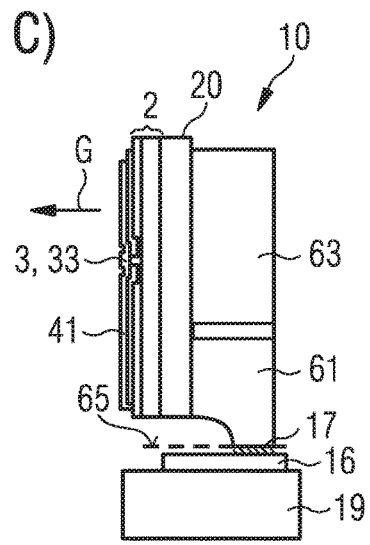
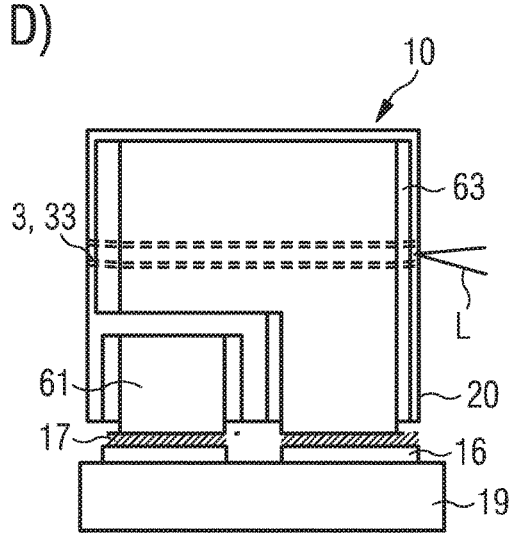

FIG 4
A)
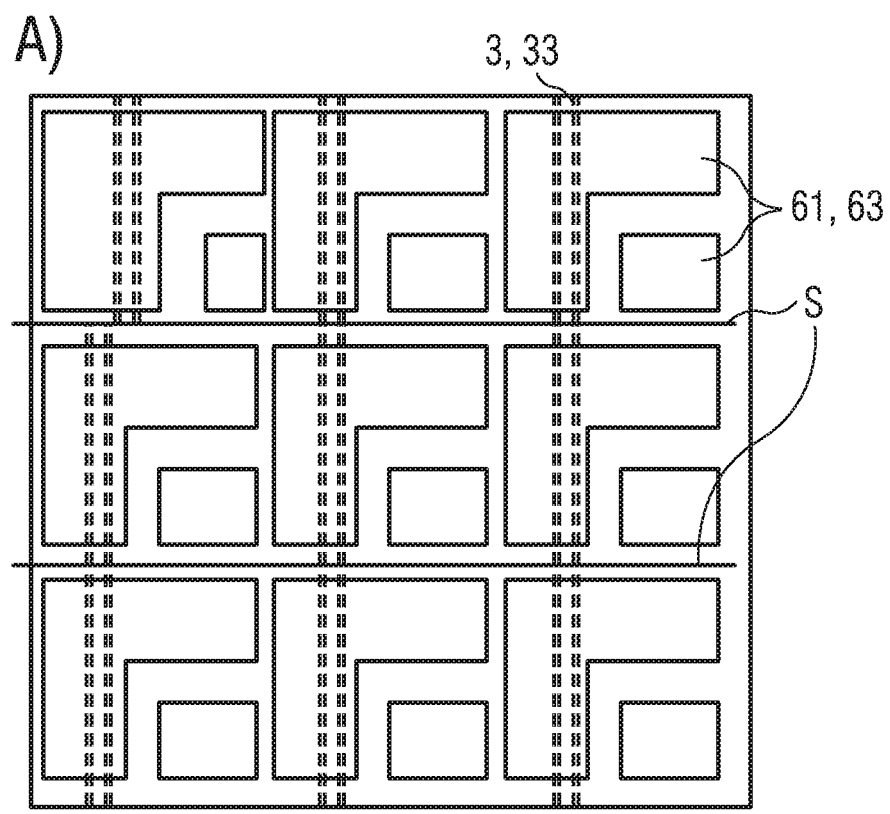
B)
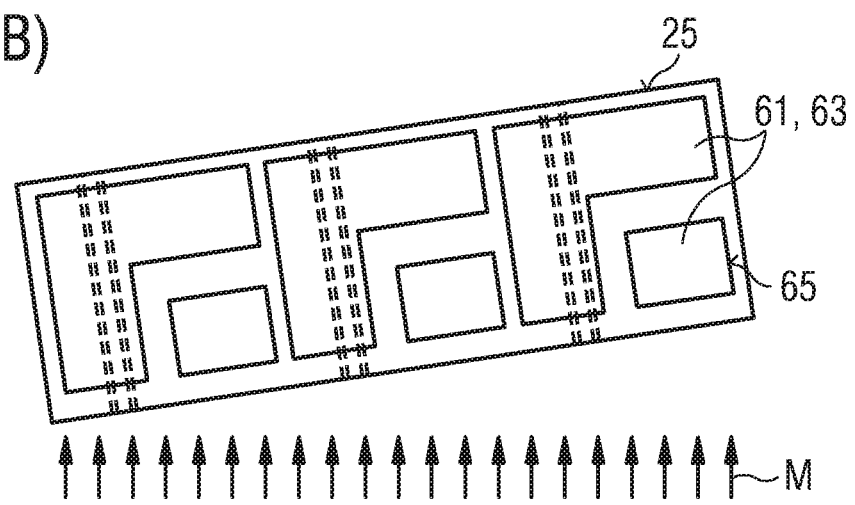

FIG 5
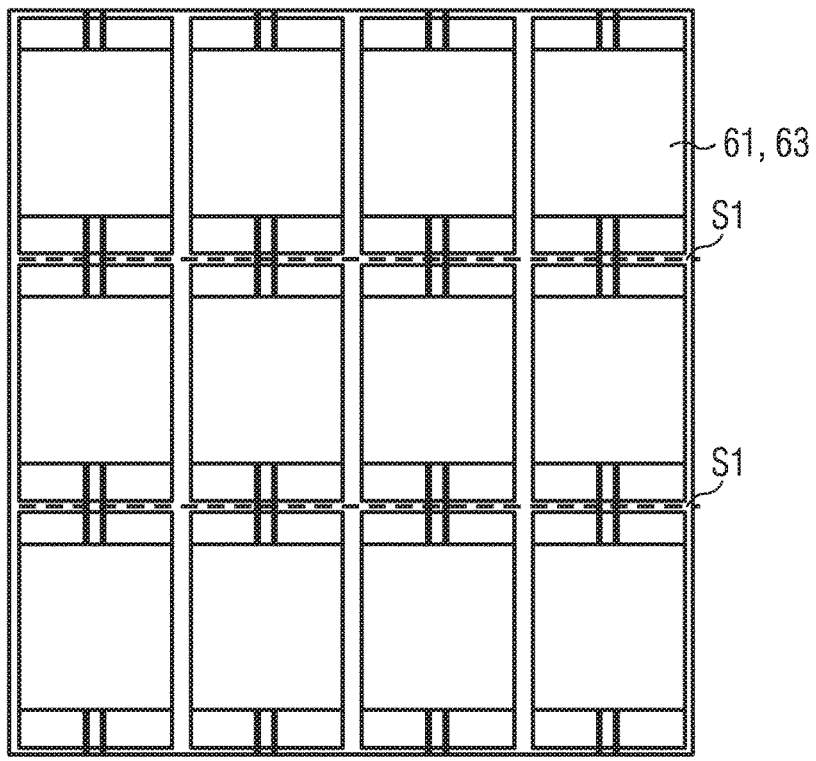
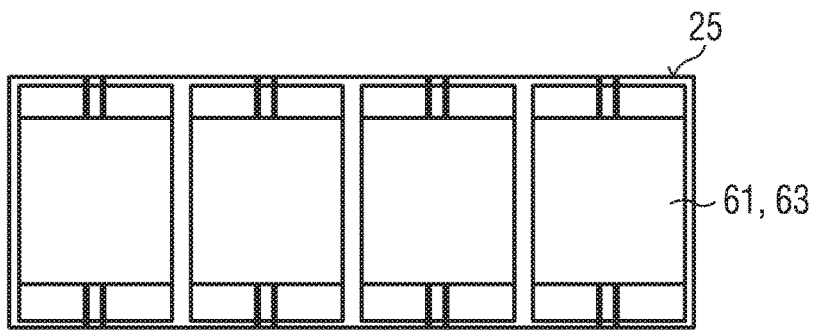
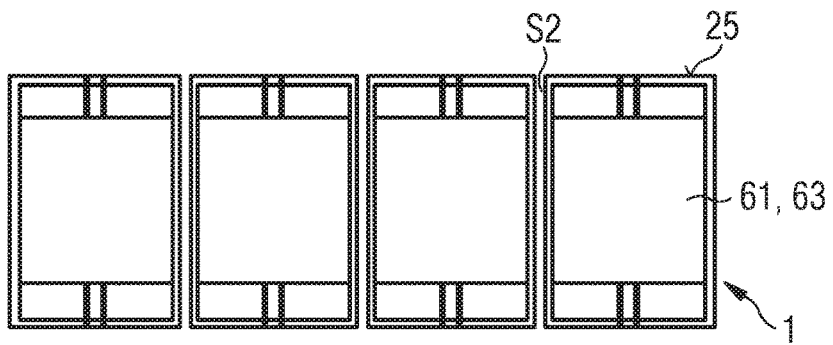

FIG 6
A)
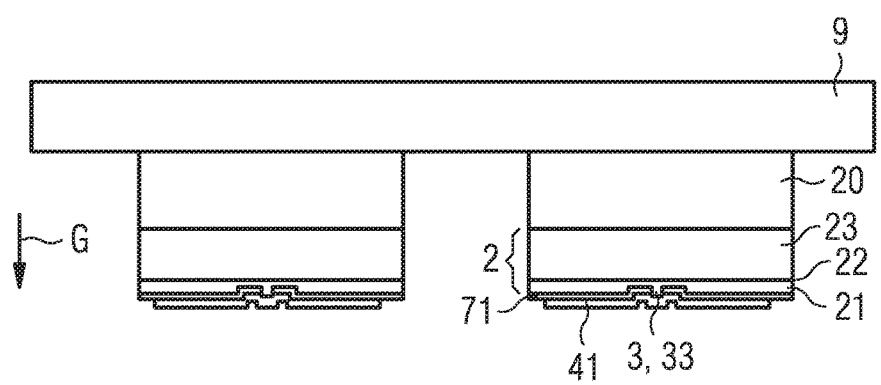
B)
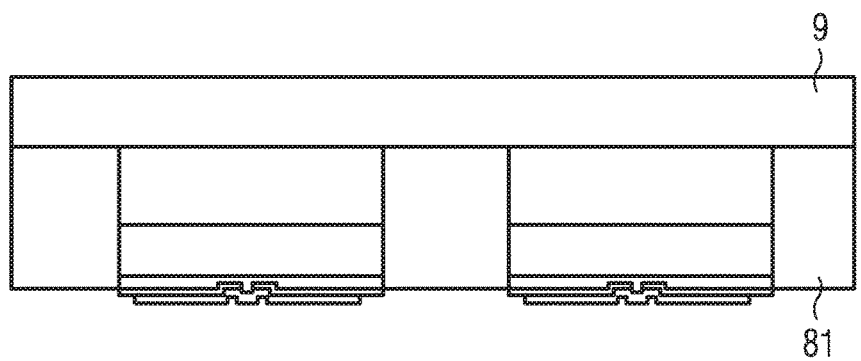
C)
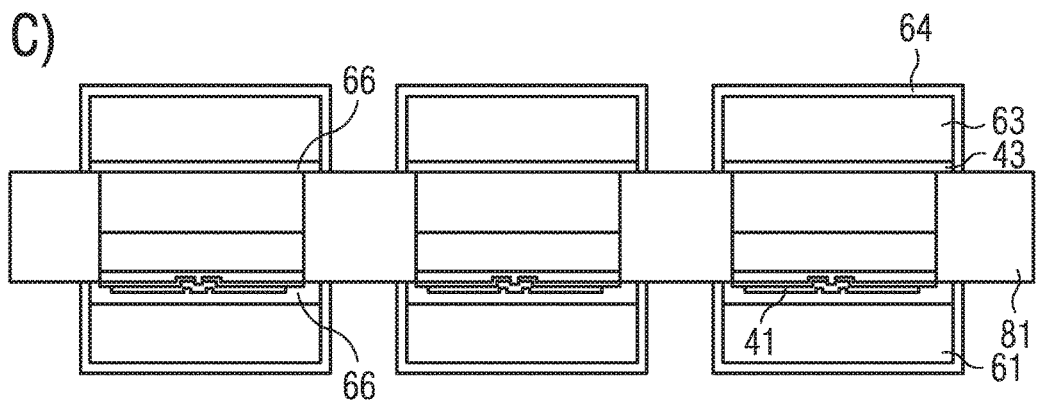

FIG 6
D)
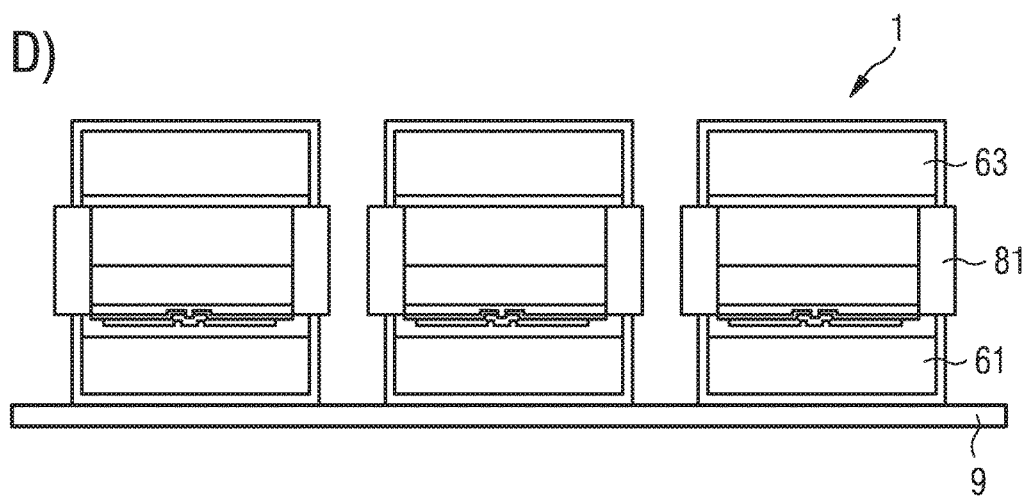
E)
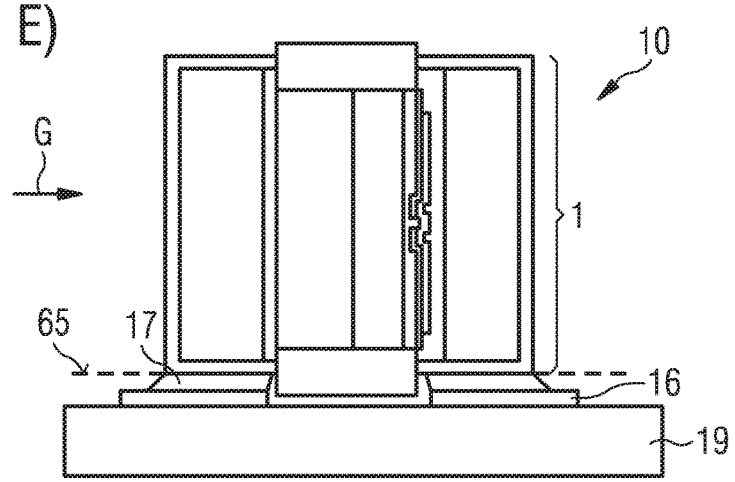

FIG 7
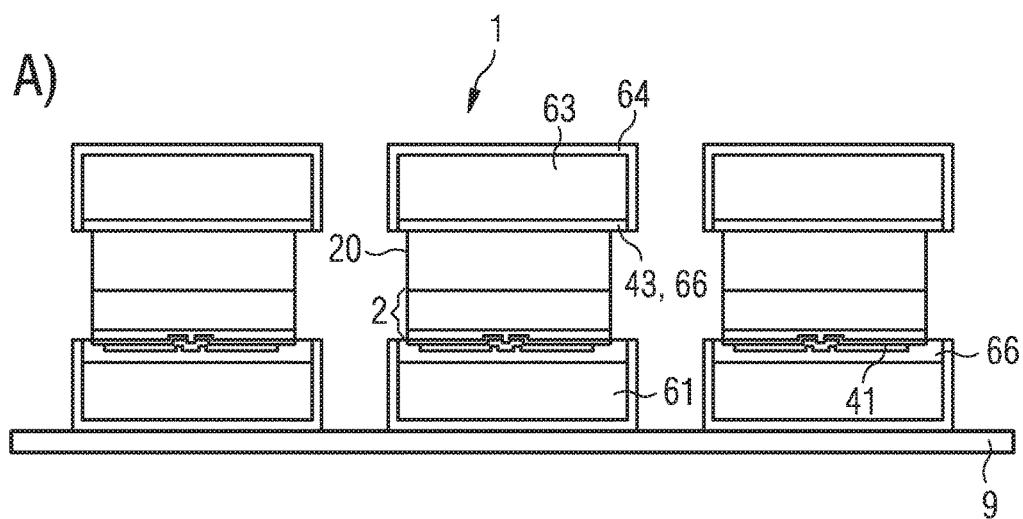
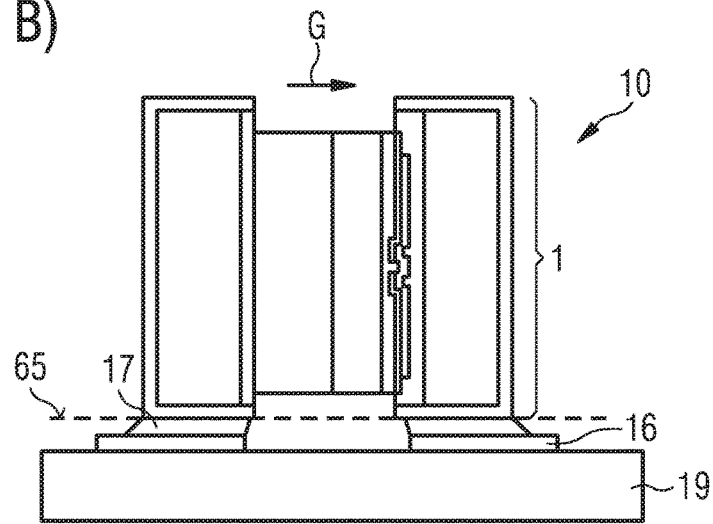

FIG 8
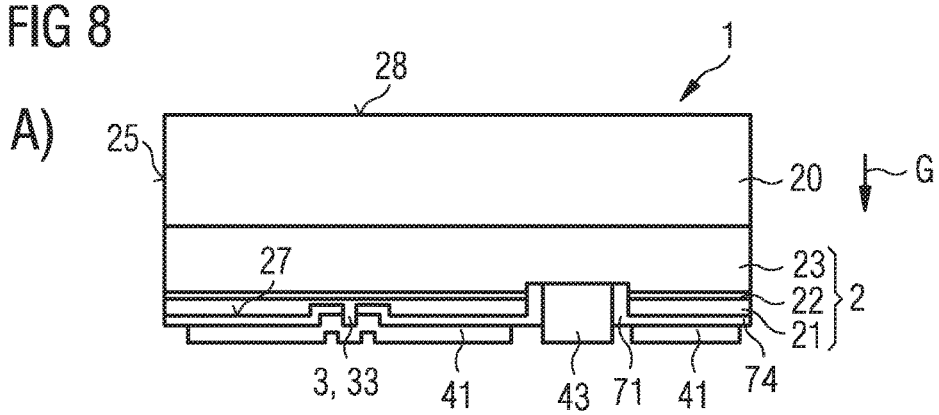
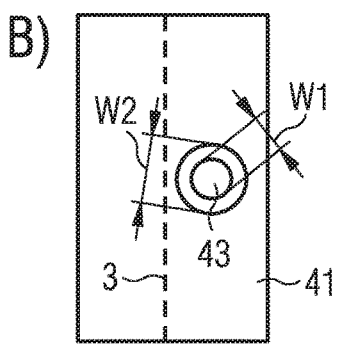
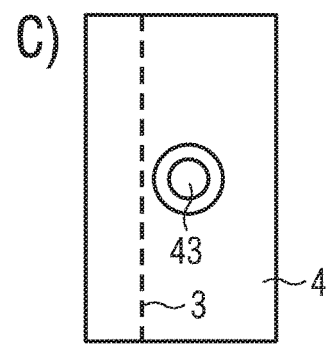
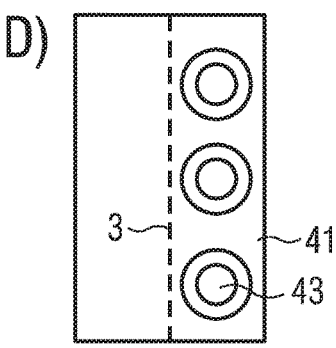
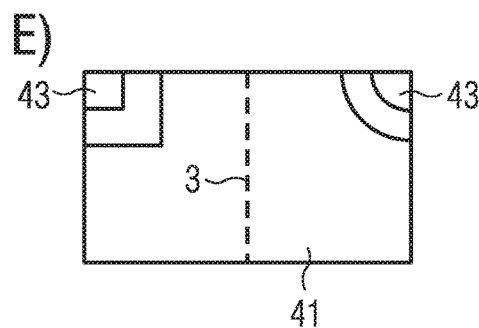
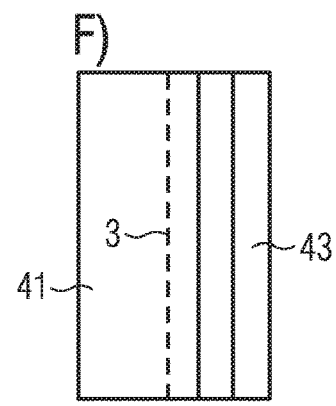
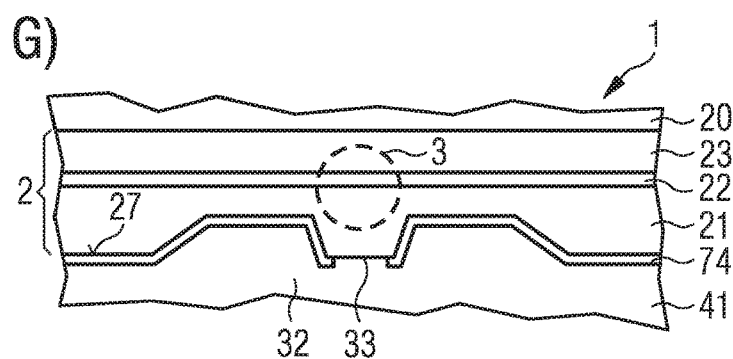

A)

Figure 10:
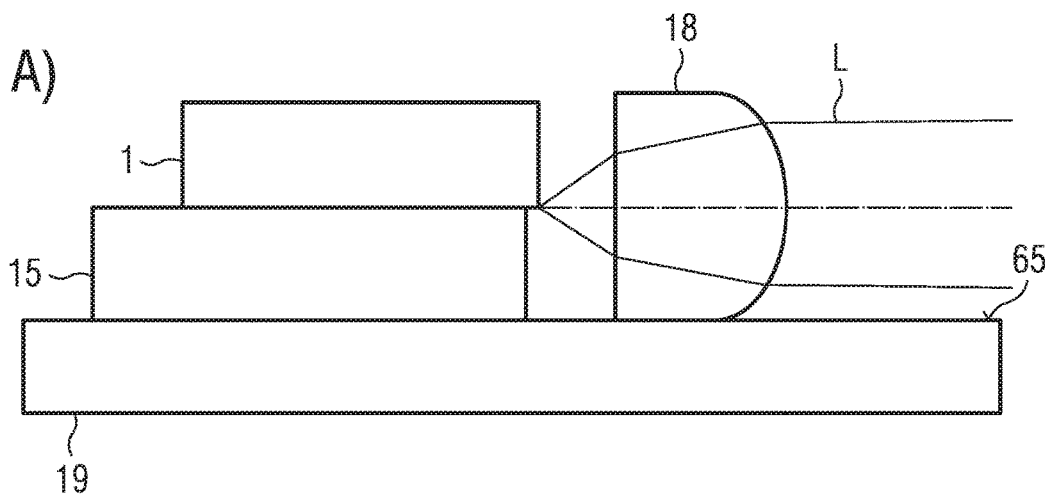

FIG 10
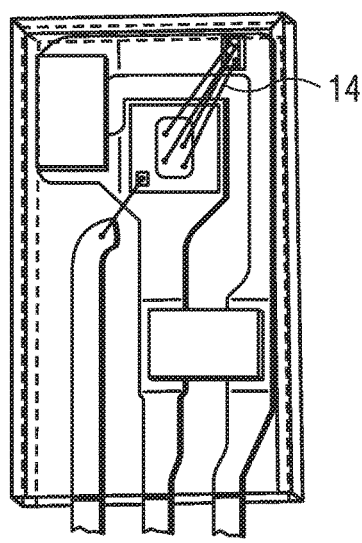
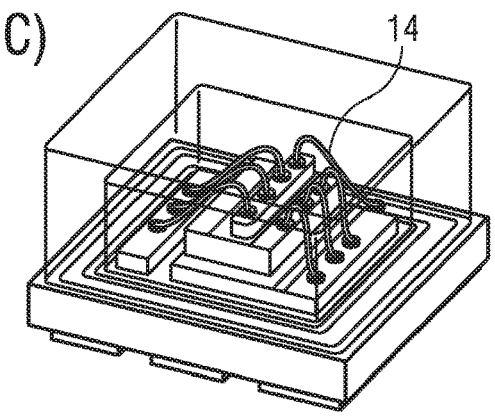
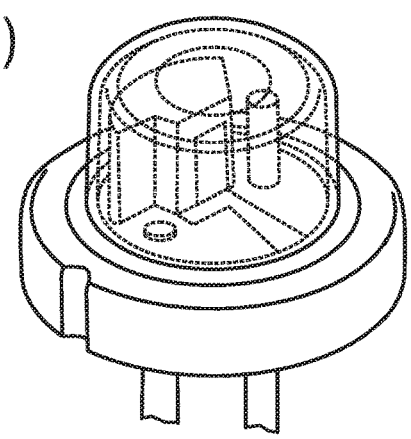

SEMICONDUCTOR LASER AND SEMICONDUCTOR LASER ARRANGEMENT

The invention relates to a semiconductor laser. The invention further relates to a semiconductor laser arrangement.

The aim of the invention is to provide a compact semiconductor laser from which waste heat can be dissipated effectively.

This object is achieved, inter alia, by a semiconductor laser having the features of patent claim 1. Preferred developments are the subject matter of the remaining claims.

According to at least one embodiment, the semiconductor laser comprises a semiconductor layer sequence. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein in each case $0 \leq n \leq 1$, $0 \leq m \leq 1$ and $n+m \leq 1$. The semiconductor layer sequence can comprise dopants and additional constituents. For the sake of simplicity, however, only the essential components of the crystal lattice of the semiconductor layer sequence are mentioned, that is Al, As, Ga, In, N or P, even if these can be partially replaced and/or supplemented by small quantities of other substances.

According to at least one embodiment, the semiconductor layer sequence comprises an n-conducting region and a p-conducting region. An active zone is located between these two regions. Along a growth direction of the semiconductor layer sequence, the p-conducting region, the active zone and the n-conducting region are preferably arranged stacked directly on top of one another.

According to at least one embodiment, the semiconductor laser has one or more resonator lines. In the at least one resonator line, a laser radiation is generated during normal operation of the semiconductor laser. The laser radiation generated in the resonator line is emitted at least partially out of the semiconductor laser. Laser radiation means, for example, that the radiation emitted by the semiconductor laser is a coherent radiation. A coherence length of the emitted radiation is, for example, at least 1 mm or 10 mm or 1 m.

According to at least one embodiment, the semiconductor laser comprises an electric p-contact, which is preferably located directly on the p-conducting region and which is set for impressing current directly into the p-conducting region. In other words, the p-conducting region is energized by the p-contact. In particular, current is impressed into the p-conducting region exclusively via the electrical p-contact.

According to at least one embodiment, the semiconductor laser comprises an electric n-contact. The n-contact is preferably located directly on the n-conducting region in places. In the same manner as the p-contact, the n-contact is set for impressing current directly into the n-conducting region. During operation of the semiconductor laser, current is impressed into the n-conducting region preferably exclusively via the n-contact.

According to at least one embodiment, the semiconductor laser comprises a p-contact area and an n-contact area. The preferably exactly two contact areas are designed for external electrical contacting of the semiconductor laser. In particular, the semiconductor laser is designed to be electrically contacted and mechanically fixed externally via the contact areas. The contact areas are preferably designed to be solderable. Alternatively, the contact areas can be fastened by means of electrically conductive adhesive bonding.

According to at least one embodiment, the contact areas are each electrically connected to the associated contact. In this case, the contact areas can be applied directly to the respective associated contacts, for example by means of galvanic deposition.

According to at least one embodiment, the contact areas are oriented partially or completely parallel to a growth direction of the semiconductor layer sequence. In other words, the semiconductor layer sequence then stands upright on the contact areas. This applies with a tolerance of at most 45° or 30° or 15° or 2°, in particular exactly. In this case, the resonator line can be oriented parallel or also perpendicular to the contact areas, with the same tolerances as indicated for the growth direction. If the contact areas are oriented parallel to the resonator line, the semiconductor laser is a so-called side looker.

According to at least one embodiment, the contact areas lie in a common mounting plane. In this case, the semiconductor laser is designed to be applied to a planar mounting surface.

According to at least one embodiment, the semiconductor laser can be surface-mounted. This means that the semiconductor laser can be connected via SMT, surface mount technology, on an external carrier which has the mounting surface. It is not necessary for parts of the semiconductor laser to penetrate the external carrier or to be embedded in the external carrier. In this way, comparatively large external contact areas can be achieved, by means of which efficient heat dissipation is also provided. For example, a thermal resistance between the active zone and the external carrier is at a maximum of 5 K/W or 2 K/W or 1 K/W as intended.

According to at least one embodiment, the semiconductor laser can be mounted without wires. This means that no bonding wires are required, in particular for electrically contacting the semiconductor laser. Wire-free, for example, can also mean that in particular no conductor tracks which are applied to a foil or a casting material are guided to the semiconductor laser, wherein the foil can conform to the semiconductor laser, as is known, for example, from documents US 2014/0227811 A1, US 2013/0256740 A1 or US 2009/0127573 A1. This technology, which is preferably not used in the present case, is also referred to as CPHF or compact planar high flux. Thus, it is possible for the external electrical and mechanical connection of the semiconductor laser to be effected solely by a flat fastening via the contact areas. In this case, a minimum diameter of a current path between the external mounting surface and the contact areas can preferably be continuously at least as large as a cross-sectional area of the contact areas on a side facing the mounting surface.

In at least one embodiment, the semiconductor laser comprises a semiconductor layer sequence. The semiconductor layer sequence comprises an n-conducting region, a p-conducting region and an active zone lying between said regions. In at least one resonator line, laser radiation is generated during operation of the semiconductor laser. The resonator line is oriented parallel to the active zone and can lie in the active zone. The semiconductor laser further comprises an electric p-contact and an electric n-contact, which are located on the associated region of the semiconductor layer sequence and which are designed to impress current directly in the associated region of the semiconductor layer sequence. Furthermore, a p-contact area, which is electrically connected to the p-contact, is provided, as well as an n-contact area, which is electrically connected to the n-contact. The p-contact area and the n-contact area are set up for external electrical and mechanical connection of the semiconductor laser. Furthermore, the p-contact area and the n-contact area are oriented parallel to a growth direction of the semiconductor layer sequence, with a tolerance of at most 45° or exactly. Finally, the semiconductor laser can be surface-mounted without wires.

Laser diodes are usually offered for so-called consumer applications in TO housings or on intermediate carriers such as ceramic carriers. However, these types of mountings for laser diodes are technically comparatively complex and relatively expensive.

In particular in TO housings, a semiconductor laser chip is mounted on a metallic housing base, for instance by means of soldering, and is electrically contacted via bonding wires. The TO housing is closed with a metallic cap and with an optical window, for instance made of glass. An external electrical contacting of such a TO housing is carried out by means of electrical contact pins, which are passed through a printed circuit board and are then electrically and mechanically fastened by soldering. In such TO housings, an achievable thermal resistance for cooling the semiconductor laser chip is comparatively high and is in the order of magnitude of 15 K/W. From this comparatively large thermal resistance, restrictions with regard to a maximum operating current of the semiconductor laser chip result. An increased thermal resistance also occurs when intermediate carriers are used.

The semiconductor laser described here can, on the one hand, be produced cost-effectively and be used in a simple manner for a customer, since a surface mounting, also referred to as SMT, is possible. On the other hand, such a semiconductor laser has a low thermal resistance towards an external heat sink. Furthermore, intermediate carriers can be dispensed with in the semiconductor laser described here.

According to at least one embodiment, the semiconductor laser can be surface-mounted. This means that the semiconductor laser can be mounted on an external carrier by means of SMT (surface mount technology). It is not necessary for parts of the semiconductor laser to penetrate the external carrier or to be embedded in the external carrier. In this way, comparatively large external contact areas can be achieved, by means of which efficient heat dissipation is also provided. For example, a thermal resistance between the active zone and the external carrier is at a maximum of 5 K/W or 2 K/W or 1 K/W in the intended use.

According to at least one embodiment, a distance between the resonator line and the mounting plane is relatively large. In this way, it is possible to prevent the emitted laser radiation from striking the external support in an undesired manner. In particular, the distance between the resonator line and the mounting plane is at least 10 µm or 40 µm or 75 µm and/or at most 0.2 mm or 0.6 mm or 1 mm.

According to at least one embodiment, the n-contact extends from the p-conducting region and through the active zone into the n-conducting region. In other words, the n-contact is a plated-through hole, also referred to as a via, through the active zone. In this case, the n-contact can also be composed of a plurality of plated-through holes or vias.

According to at least one embodiment, the n-conducting region is designed for current conduction and/or current spreading in the direction parallel to the active zone. A current flow then takes place from the n-contact via the n-conducting region, wherein a main current flow direction in the n-conducting region is preferably oriented perpendicular to a main current direction in the n-contact. The active zone is supplied with current from the n-conducting region to the p-conducting region and towards the p-contact, wherein a current direction is preferably oriented antiparallel to a main current direction in the n-contact.

According to at least one embodiment, viewed in plan view in particular on the p-conducting region, the at least one resonator line is arranged beside the electrical n-contact, at least within the semiconductor layer sequence. This can mean that the resonator line and the n-contact do not intersect and do not touch each other in a plane of the active zone. In particular, the laser radiation guided in the resonator line does not or not significantly reach the n-contact.

According to at least one embodiment, in at least one cross section parallel to the active zone, the n-contact is surrounded all around by a material of the semiconductor layer sequence. In particular, in the region of the p-conducting region and in the plane of the active zone, the n-contact is surrounded all around by a closed, continuous path of the associated semiconductor material. In other words, the n-contact is not exposed in the lateral direction in the area of the semiconductor layer sequence.

As an alternative to this, it is possible for the n-contact to be attached to an edge of the semiconductor layer sequence and to be laterally exposed or to be not covered laterally by a material of the semiconductor layer sequence. In this case, however, it is preferred that in a plan view the n-contact is completely covered by the n-conducting region.

According to at least one embodiment, the n-contact and/or the p-contact consist of one or more metals. In this case, the n-contact and the p-contact can partially or entirely consist of the same metals. For example, the n-contact and/or the p-contact comprise one or more of the following metals or consist of one or more of these metals: silver, gold, platinum, palladium, tungsten, nickel, titanium, rhodium.

According to at least one embodiment, the n-contact ends within the n-conducting region. In other words, in the direction perpendicular to the active zone, the n-contact then passes through the n-conducting region only partly. For example, the n-contact penetrates the n-conducting region coming from the p-conducting region as far as at most 20% or 50%, relative to a thickness of the n-conducting region.

According to at least one embodiment, the p-contact completely runs through the semiconductor layer sequence. For example, the p-contact first extends parallel along the p-conducting region or covers the p-conducting region predominantly or completely and subsequently bends in the direction towards the active zone 22. Such a through-connection for the p-region through the active zone is preferably located next to the resonator line, seen in plan view.

According to at least one embodiment, all contact areas are located on the same side of the semiconductor layer sequence. The contact areas can be arranged on the side of the n-region or also on the side of the p-region.

According to at least one embodiment, the p-contact area is located on a different side of the semiconductor layer sequence than the n-contact area. In this case, it is possible for the resonator line to be arranged at least partially between the contact areas. In such an arrangement, both contact areas can be designed comparatively large and, viewed in a plan view, can cover at least 50% or 80% or all of the semiconductor layer sequence. In such an arrangement, a particularly efficient dissipation of waste heat from the semiconductor laser is also possible.

According to at least one embodiment, the semiconductor laser comprises a ridge waveguide, also referred to as a ridge. In other words, the semiconductor laser is a stripe laser, also referred to as a ridge laser. The resonator line is defined by the ridge waveguide. In particular, the ridge waveguide and the resonator line, viewed in a plan view, are congruent or predominantly congruent. A current impression from the p-contact into the semiconductor layer sequence is preferably restricted to the ridge waveguide or to a part of the ridge waveguide.

According to at least one embodiment, the ridge waveguide is limited on both sides by trenches in the semiconductor layer sequence. In other words, the ridge waveguide is formed from the semiconductor layer sequence by etching, in particular exclusively out of the p-conducting region. In this case, the trenches do not reach as far as the active zone. Apart from the trenches, the semiconductor layer sequence can have a constant, uniform thickness.

According to at least one embodiment, the trenches are at least partially filled with the p-contact. In other words, the metallic material of the p-contact is located in the trenches. The p-contact is preferably not restricted to the trenches.

According to at least one embodiment, the resonator line is arranged within the active zone. A light amplification is then restricted to the active zone. In this case, the resonator line preferably runs perpendicular to mutually opposite facets of the semiconductor layer sequence. The facets are lateral boundary surfaces of the semiconductor layer sequence. A degree of reflection of resonator end faces can be adjusted by means of the facets themselves and/or by means of optically effective coatings on the facets.

According to at least one embodiment, the electrical contact areas laterally project beyond the semiconductor layer sequence, that is to say in the direction parallel to the active zone and in particular in a plan view of the p-conducting region. In this case, it is possible for the contact areas to project beyond the semiconductor layer sequence exclusively in the direction towards the mounting plane. Alternatively, one or all of the contact areas can project beyond the semiconductor layer sequence on several or on all sides. In a projection perpendicular to the mounting plane, the semiconductor layer sequence can be free of a material for the contact areas and/or for the contacts. In other words, when viewed in a plan view of the mounting plane, the semiconductor layer sequence is located next to the contact areas.

According to at least one embodiment, the contact areas, in particular in the mounting plane, are arranged along a straight line. This straight line preferably runs parallel to the resonator line and/or, viewed in a plan view, alongside the resonator line.

According to at least one embodiment, one of the contact areas is L-shaped when viewed in a plan view of the semiconductor layer sequence. In other words, said contact area forms a rectangle in which a corner is cut out when viewed in a plan view. The other one of the contact areas is located in a space between the legs of this L or in the recessed corner. In this case, the contact areas preferably do not touch each other, so that a gap filled with an insulating solid or a gap filled with air can be present between the contact areas.

According to at least one embodiment, the semiconductor laser comprises a casting body. Viewed in a plan view, the casting body preferably surrounds the semiconductor layer sequence all around and/or in a closed path. The semiconductor layer sequence can be mechanically fixedly connected to the casting body.

According to at least one embodiment, the casting body is formed from at least one plastic. Preferably, the plastic is a light-transmissive, transparent plastic such as an acrylate or a polycarbonate or an epoxide or a silicone. In particular, the plastic is designed to be irradiated by the laser radiation. However, it is preferably possible for the casting body not to be present in the region of a light exit surface of the semiconductor layer sequence, so that the laser radiation can exit from the semiconductor laser without having to be guided through the casting body.

According to at least one embodiment, a thickness of the casting body is equal to a thickness of the semiconductor layer sequence or a thickness of the semiconductor layer sequence together with the growth substrate. This applies in particular with a tolerance of at most 5 μm or 3 μm or 1.5 μm. In this case, boundary surfaces of the casting body are preferably exclusively parallel and perpendicular to the active zone. In other words, the casting body can be a cuboid, wherein preferably a boundary surface of the semiconductor layer sequence, in particular the top side thereof, lies in one side of said cuboid.

According to at least one embodiment, the semiconductor laser has lateral dimensions, that is to say dimensions in the direction parallel to the active zone, which amount to at most three times or twice or 1.4 times the corresponding dimensions of the semiconductor layer sequence. In other words, the semiconductor laser can have a housing which is substantially predetermined by the size of the semiconductor layer sequence. Such a housing construction is also referred to as a CSP or chip-size package. Alternatively, it is possible for the semiconductor laser to be free of a housing and/or a casting body and that lateral dimensions are specified exclusively by the semiconductor layer sequence. In the latter case, it is possible for the semiconductor laser to consist exclusively of inorganic materials.

According to at least one embodiment, in the direction parallel to the active zone, the casting body projects beyond the contact areas and/or the semiconductor layer sequence. In this case, the casting body can project all around or only on certain sides or only in places. A width or average width of this projection is, for example, at least 2 μm or 5 μm or 10 μm and/or at most 0.1 mm or 50 μm or 20 μm. Alternatively, the casting body can end flush with the contact areas or with one of the contact areas in the lateral direction.

According to at least one embodiment, a thickness or a mean thickness of the contact areas or of at least one of the contact areas, in the direction perpendicular to the active zone, is at least 25 μm or 40 μm or 0.1 mm. Alternatively or additionally, this value is at most 1 mm or 0.6 mm or 0.4 mm.

According to at least one embodiment, the p-contact, the n-contact and the contact areas are set back relative to the facets of the semiconductor layer sequence. In this way, the facets can be produced by scoring and splitting, without adversely affecting the contacts or contact areas made of metal.

According to at least one embodiment, one of the contact areas has one or more roundings. The at least one rounding can be convex or also concave. The convex rounding preferably points towards the semiconductor layer sequence, so that the contact area in question widens in the direction away from the semiconductor layer sequence. In a cross section perpendicular to the contact areas and to the semiconductor layer sequence, the rounding can be semicircular. The rounding is furthermore preferably restricted to the one or more contact areas.

Furthermore, a semiconductor laser arrangement is specified. The semiconductor laser arrangement comprises at least one semiconductor laser as indicated in connection with one or more of the above-mentioned embodiments.

Features of the semiconductor laser arrangement are therefore also disclosed for the semiconductor laser and vice versa.

In at least one embodiment, the semiconductor laser arrangement comprises at least one semiconductor laser as specified above. Furthermore, the semiconductor laser arrangement has a mounting support on which the semiconductor laser is fastened, wherein an electrical and mechanical fastening takes place exclusively via the p-contact area and the n-contact area. In addition, the semiconductor laser arrangement comprises an optical element for beam shaping of the laser radiation, preferably a lens such as a cylindrical lens. The optical element can be applied directly to the mounting support and is preferably arranged directly downstream of the semiconductor laser.

By means of such an arrangement, larger mounting surfaces of the optical element can also be achieved; in addition, there is no dependence on an adhesive layer thickness during the fastening of the optical element.

Finally, a method for producing such a semiconductor laser is also specified. By means of the method, in particular a semiconductor laser is produced as specified in connection with one or more of the above-mentioned embodiments. Features of the method are therefore also disclosed for the semiconductor laser and the semiconductor laser arrangement and vice versa.

A semiconductor laser described here and a semiconductor laser arrangement described here are explained in more detail below with reference to the drawing on the basis of exemplary embodiments. Identical reference sings indicate the same elements in the individual figures. In this case, however, no relationships to scale are illustrated, rather individual elements can be represented with an exaggerated size in order to afford a better understanding.

In the figures:

FIGS. 1 to 3 and 9 show Schematic representations of exemplary embodiments of semiconductor laser arrangements described here with semiconductor lasers described here, FIGS. 4 to 7 show schematic representations of method steps for methods for producing semiconductor lasers described here, FIG. 8 shows schematic representations of exemplary embodiments of semiconductor lasers described here for semiconductor laser arrangements described here, and FIG. 10 shows schematic representations of modifications of semiconductor laser arrangements.

FIG. 1 shows an exemplary embodiment of a semiconductor laser 1 and of a semiconductor laser arrangement 10. FIG. 1A shows a plan view and FIG. 1B shows a sectional illustration along the line A-A from FIG. 1A of the semiconductor laser 1. FIG. 1C shows a side view and FIG. 1B illustrates a front view of a semiconductor laser arrangement 10.

The semiconductor laser 1 has a semiconductor layer sequence 2. The semiconductor layer sequence 2 has an active zone 22 which is located between a p-conducting region 21 and an n-conducting region 23. The semiconductor layer sequence 2 is located on a growth substrate 20. The n-conducting region 23 is electrically contacted through the active zone 22 via a metallic n-contact 43. The p-conducting region 21 is supplied with current via an electric p-contact 41.

The electrical current is impressed into the p-conducting region 21 only in the region of a ridge waveguide 33. In order to limit the current impression, an electrical insulation 71 is applied locally. A resonator line 3 is defined via the ridge waveguide, which is located between two mutually opposite facets 25 of the semiconductor layer sequence 2. One of the facets 25 is preferably coated in a reflective manner, not shown; a further one of the facets 25 serves for coupling out a laser radiation L generated in the semiconductor laser 1.

For external electrical contacting, the semiconductor laser 1 has an electric p-contact area 61 and an electric n-contact area 63. The two contact areas 61, 63 follow the contacts 41, 43 along a growth direction G of the semiconductor layer sequence 2. Both contact areas 61, 63 are preferably provided with a contact metallization 64. The contact areas 61, 63 are connected by means of the contact metallization 64 via a solder 17 to conductor tracks 16 on a mounting support 19 both electrically and mechanically.

The contact areas 61, 63 themselves are preferably comparatively thick, for example having a thickness of between 40 µm and 600 µm inclusive. For example, the contact areas 61, 63 are formed from copper, which can be applied galvanically to the contacts 41, 43. In contrast, a thickness of the contact metallization 64 is preferably relatively small, in particular at least 0.5 µm and/or at most 5 µm. The contact metallization 64 is preferably formed from nickel and gold, wherein the contact metallization 64 can also be formed as multiple layers and can optionally also contain platinum, palladium and/or titanium.

In this case, the contact metallization 64 preferably covers all sides of the contact areas 61, 63 facing away from the semiconductor layer sequence 2. Moreover, all sides of the contact areas 61, 63 that run transverse, in particular perpendicular to the semiconductor layer sequence 2 are covered by the contact metallization 64.

The contact areas 61, 63 project beyond the semiconductor layer sequence 2 on one side, that is on the side which is oriented parallel to the resonator line 3. As a result and due to the comparatively large thickness of the contact areas 61, 63, the semiconductor laser 1 can be mounted on the conductor tracks 16, which run parallel to the growth direction G. In other words, the semiconductor layer sequence 2 then stands in the assembled state of the semiconductor laser 1 perpendicular to the conductor tracks 16, which define a mounting plane 65, see for example FIG. 1C. Thus, the resonator line 3 runs parallel to the conductor tracks 16. In addition, the resonator line 3 has a comparatively large distance from the mounting support 19, so that the laser radiation L can leave the arrangement 10 without being influenced by the mounting support 19.

Viewed in a plan view, see FIG. 1A, the p-contact area 61 is L-shaped. In a remaining corner, the smaller n-contact area 63 is located. The respective contacts 41, 43 can project beyond the associated contact areas 61, 63 in the direction parallel to the resonator line 3 and/or can terminate flush with the associated contact areas 61, 63 in the direction perpendicular to the resonator line 3.

On that side of the contact areas 61, 63 which projects beyond the semiconductor layer sequence 2 and which is set up for mounting on the conductor tracks 16, a rounding R is present in the direction towards the semiconductor layer sequence 2. This rounding R arises in particular when the semiconductor layer sequence 2 is singulated from a wafer into the semiconductor lasers 1, for instance by a comparatively wide saw cut or by plasma separation. A width of the rounding R, in the direction parallel to the active zone 22, is preferably at least 50 µm and/or at most 100 µm.

The boundary surface of the semiconductor layer sequence 2 produced by the singulation is preferably protected by a side wall passivation, not shown. The contact metallization 64 is not present in the rounding R. As a result, creeping of the solder 17 towards the semiconductor layer sequence 2 can be reduced or avoided.

By virtue of the fact that the p-contact area 61 is applied to the p-conducting region 21 over a large area, efficient cooling of the p-conducting region 21 is made possible.

The mounting support 19 is, for example, a ceramic substrate having a high thermal conductivity. Likewise, the mounting support 19 can be designed as a printed circuit board and/or a metal core board.

In the exemplary embodiment of the semiconductor laser 1 and the arrangement 10 of FIG. 2, the contact areas 61, 63 are located on the side of the growth substrate 20. The representations in FIGS. 2A to 2D are analogous to FIGS. 1A to 1D.

The p-contact 41 is connected to the p-contact area 61 through the entire semiconductor layer sequence 2 and through the entire growth substrate 20. Apart from regions close to the facets 25, the p-contact 41 covers the entire p-conducting region 21, whereas the active zone 22 is supplied with current only in the region of the ridge waveguide 33 due to the insulation 71. Unlike in FIG. 2B, a metallization analogous to the n-contact 43 can also be present on the growth substrate 20 in the region of the p-contact area 61, in order to enable a particularly galvanic application of the two contact areas 61, 63 to the growth substrate 20.

During this attachment of the contact areas 61, 63 on the growth substrate 20, mechanical stresses on the ridge waveguide 33 can be reduced and an increased mode stability of the laser radiation L can be achieved.

In the exemplary embodiment of FIG. 3, see the sectional representation in FIG. 3A, the top view in FIG. 3B and a side view of the arrangement 10 in FIG. 3C, the contact areas 61, 63 are arranged on both sides of the semiconductor layer sequence 2. With such an arrangement of the contact areas 61, 63 a particularly efficient cooling of the semiconductor layer sequence 2 can be achieved.

In this case, the semiconductor layer sequence 2, together with the growth substrate 20, can project beyond the contact areas 61, 63. A projection of the growth substrate 20 over the contact areas 61, 63 is preferably at least 5 μm and/or at most 50 μm. The contact metallization 64 can completely cover all surfaces of the contact areas 61, 63 not facing the contacts 41, 43.

The resonator line 3 and the growth direction G are oriented parallel to the mounting plane 65, see FIG. 3C. Deviating from the representation in FIG. 3C, it is also possible for the resonator line 3 to be oriented perpendicular to the mounting plane 65 so that the laser radiation would then be emitted in the direction away from the mounting support 19. The semiconductor layer sequence 2 can be slightly recessed relative to the growth substrate 20. Optionally, electrically insulating coatings (not shown) can be present on the semiconductor layer sequence 2 and/or on the growth substrate 20 in order to prevent the solder 17 from creeping onto the semiconductor layer sequence 2 or, in the event of creep, to avoid electrical shorts.

The mounting support 19 can likewise be a ceramic substrate. Prior to mounting of the semiconductor laser 1, the solder 17 is preferably already located on the conductor tracks 16. For example, the solder 17 is present as a solder pad, for example as a dimensionally stable, so-called Au sponge, as a sintered dimensionally stable silver layer, as a gold coating for SAC soldering or also as an AuSn depot.

In FIG. 4, method steps for producing semiconductor lasers 1, in particular as indicated in connection with FIG. 1 or 2, are shown in schematic plan views. Still in the wafer composite, the contact areas 61, 63 and the contact metallization 64 are produced in a structured manner, see FIG. 4A. In the direction perpendicular to the resonator line 3, the ridge waveguides 33 and between the contact areas 61, 63 by means of scoring and breaking a separation of the wafer into individual bars is carried out along separation lines S.

A coating material M is applied to the facets 25, which have been produced via breaking by means of a preferably directed coating method, see FIG. 4B. A reflectivity of the facets 25 can be adjusted by means of the coating material M. By way of example, a highly reflective Bragg mirror is produced on one of the facets 25 and an antireflection layer is produced on the opposite facet 25.

When the coating material M is applied, the bars are preferably positioned obliquely. As a result, the contact areas 61, 63 remain free of the coating material M at the mounting plane 65.

In the direction parallel to the resonator lines 3, the bars are subsequently separated, not shown, by means of sawing or plasma separation. During this separation, the roundings R are generated.

In FIG. 5, a production method for the semiconductor laser 1 according to FIG. 3 is illustrated in schematic plan views.

A scoring and breaking takes place between the metal structures 41, 43, 61, 63 along the separation lines S1. The obtained bars, see FIG. 5B, are then preferably coated as illustrated in connection with FIG. 4B. Subsequently, by means of sawing, for example, separation along separation lines S2 to form the semiconductor lasers 1 takes place.

FIG. 6 shows sectional illustrations of a method for producing a further exemplary embodiment of the semiconductor laser 1. The semiconductor layer sequence 2 and the growth substrate 20 are applied, singulated and expanded onto a temporary intermediate carrier 9, see FIG. 5A. The intermediate carrier 9 is in particular an expandable film, wherein a further, not shown, and mechanically stable carrier can be present.

A casting body 81 is subsequently produced, see FIG. 6B. The casting body 81 is formed from a plastic. The casting body 81 can be designed to be transparent, reflecting or also absorbing for the laser radiation L. It is possible for admixtures to be added to the casting body 81, for example in order to adjust the optical properties, a thermal behaviour and/or mechanical properties of the casting body 81. The casting body 81 is produced by means of extrusion or molding, in particular with the aid of films.

In the method step as shown in FIG. 6C, the contact areas 61, 63 are produced. For this purpose, a metallic base layer 66 and subsequently a lacquer mask (not shown) are preferably applied, whereupon electroplating with copper is carried out for the contact areas 61, 63. Subsequently, the metallic base layer 66 is removed in regions next to the contact areas 61, 63 and the contact metallization 64 is applied. The base layer 66 on the growth substrate 20 can simultaneously serve as an n-contact 43. In this case, the finished contact areas 61, 63 extend partially onto the casting body 81.

According to the method step of FIG. 6D, the semiconductor lasers 1 are applied to a further intermediate carrier 9, and the casting body 81 is divided, for example, by means of sawing. In this case, the casting body 81 preferably projects beyond the contact areas 61, 63 all around. A projection of the casting body 81 beyond the contact areas 61, 63 is, for example, at least 5 μm and/or at most 50 μm.

In FIG. 6E, the semiconductor laser 1 mounted on the mounting carrier 19 can be seen, analogously to FIG. 3C.

The method of FIG. 7 produces a semiconductor laser 1 in which the contact areas 61, 63 project beyond the semiconductor layer sequence 2 and the growth substrate 20. The method steps preceding FIG. 7A preferably are carried out as shown in FIGS. 6A to 6C. However, the casting body 81 in this case is only a temporary casting body which is in particular chemically dissolved away so that the components of FIG. 7A are produced.

The arrangement 10 with the attached semiconductor laser 1 and the mounting support 19 is shown in FIG. 7B.

FIG. 8A shows a sectional view and FIGS. 8B to 8F show plan views of exemplary embodiments of the semiconductor laser 1, wherein the contact areas 61, 63 are not shown. Furthermore, FIG. 8G illustrates a detailed view from FIG. 8A.

The semiconductor laser 1 comprises the growth substrate 20 on which the semiconductor layer sequence 2 is epitaxially grown. The semiconductor layer sequence 2 is preferably based on the material system AlInGaN. The growth substrate 20 is preferably a GaN substrate. The active zone 22 is preferably a multi-quantum well structure, also referred to as MQW. A thickness of the semiconductor layer sequence 2 is, for example, between 2 µm and 10 µm inclusive. A thickness of the growth substrate 20 is, for example, at least 40 µm and/or at most 400 µm.

During operation, the laser radiation is generated in the active zone 22 in the region of the ridge waveguide 33. The resonator line 3, which is oriented perpendicular to the facets 25, is defined by the ridge waveguide 33. The ridge waveguide 33 is limited on both sides by trenches 32 and is defined by the trenches 32. The trenches 32 and thus the ridge waveguide 33 are produced, for instance, by etching the p-conducting region 21. The laser radiation has, for example, a wavelength of maximum intensity of at least 360 nm or 400 nm and/or of at most 560 nm or 485 nm. The laser radiation is in particular ultraviolet radiation or blue light, for example when the semiconductor layer sequence 2 is based on AlInGaN. If the semiconductor layer sequence 2 is based on AlGaInP or AlInGaAs, the emitted laser radiation L is preferably red light or infrared radiation.

A width of the ridge waveguide 33 is preferably at least 1.5 µm and/or at most 15 µm. A total width of the semiconductor layer sequence 2, in the direction perpendicular to the resonator line 3, is in particular at least 200 µm and/or at most 1 mm. Along the resonator line 3, an extent of the semiconductor layer sequence 2 is, for example, at least 200 µm and/or at most 3 mm, depending on an optical power of the semiconductor laser 1.

According to FIG. 8, the ridge waveguide 33 is located in the p-conducting region 21. As an alternative, as well as in all other exemplary embodiments, it is possible that the ridge waveguide 33 is located in the n-conducting region 23. The contacts 41, 43 are formed by one or more metals. Viewed in a plan view of an underside 27, the contacts 41, 43 do not overlap. A thickness or average thickness of the p-contact 41 is, for example, approximately 2 µm. In the direction away from the active zone 22, the p-contact 41 and the n-contact 43 preferably terminate flush with one another.

The n-contact 43 extends from the p-conducting region 21 through the active zone 22 into the n-conducting region 23 and ends in the latter. Viewed in a plan view, the n-contact 43 is of circular shape. A diameter W1 of the n-contact 43 is, for example, at least 5 µm or 10 µm or 20 µm and/or at most 60 µm or 40 µm. In the lateral direction, the n-contact is surrounded all around by an electrical insulation 71. This electrical insulation 71 extends as far as a side of the n-contact 43 facing away from the p-conducting region 21, wherein said side of the n-contact is free of the insulation 71. An outer diameter of the electrical insulation 71 W2 is preferably at most 200 µm or 100 µm or 60 µm and/or at least 40 µm or 60 µm or 120 µm.

Furthermore, viewed in a plan view, the n-contact 43 is spaced apart from the resonator line 3. A distance D between the resonator line 3 and the n-contact 43 is, for example, at least 20 µm and/or at most 200 µm.

A material of the p-contact 41 is applied nearly over the whole area to the underside 27 of the semiconductor layer sequence 2, wherein the p-contact 41 preferably does not extend entirely as far as the facets 25. However, a current is impressed into the semiconductor layer sequence 2 only in the region of the ridge waveguide 33. In the remaining regions, an electrical insulation layer 74 is located between the p-contact 41 and the p-conducting region 21, and is for example made in the same way as the insulation 71 e.g. of silicon dioxide or of silicon nitride.

The insulation layer 74 can extend to a side of the ridge waveguide 33 facing away from the active zone 22 and can partially cover the latter. Alternatively, it is possible that side surfaces of the ridge waveguide 33 are not covered by the insulation layer 74 and that the insulation layer 74 ends on a bottom surface of the trenches 32. As is preferred in all other exemplary embodiments, too, the trenches 32 do not reach as far as the active zone 22.

FIGS. 8B to 8F illustrate examples for the configuration of the contacts 41, 43. According to FIG. 8B, the resonator line 3 is arranged centrally in the semiconductor layer sequence 2 and the n-contact 43 is thus arranged off-centre. In the exemplary embodiment of FIG. 8C, the n-contact 43 is located centrally in the semiconductor layer sequence 2, seen in plan view. The resonator line 3 is arranged ineccentrically.

In the exemplary embodiment of FIG. 8D, a plurality of partial regions are present for the n-contact 43, which are arranged along the resonator line 3. Viewed in a plan view, preferably all partial regions for the n-contact are shaped identical.

In the exemplary embodiment as shown in FIG. 8E, partial regions for the n-contact 43 are located on both sides of the resonator line 3. This can also be the case in all other exemplary embodiments. The partial areas 43 can be rectangular or shaped as circular sectors. FIG. 8E illustrates that the partial regions have different shapes, seen in plan view. However, the partial regions 43 are preferably shaped identical.

In the exemplary embodiment of FIG. 8F, the n-contact 43 extends in the form of a strip along the entire or almost the entire resonator line 3. As in all other exemplary embodiments, however, the n-contact 43 is particularly preferably surrounded all around by a material of the semiconductor layer sequence 2, which is not shown here.

In particular in the exemplary embodiments of FIGS. 8D and 8F, it is preferred that the electric n-contact 43 is present on both sides and is shaped symmetrical with respect to the resonator line 3. As a result, uniform current injection into the resonator line 3 is possible and efficient heat dissipation away from the semiconductor layer sequence 2 can also be ensured.

Unlike in FIG. 8, the resonator line 3 can extend not only along a straight line but can also be angled. This is possible, for example, if the semiconductor layer sequence 2 has a facet tilted by 45° in a corner region on which a mirroring of the laser radiation takes place. Thus, in the case of the semiconductor lasers 1 described here, more complicated resonator lines 3, for example L-shaped or U-shaped, can also be realized.

Figure 9:
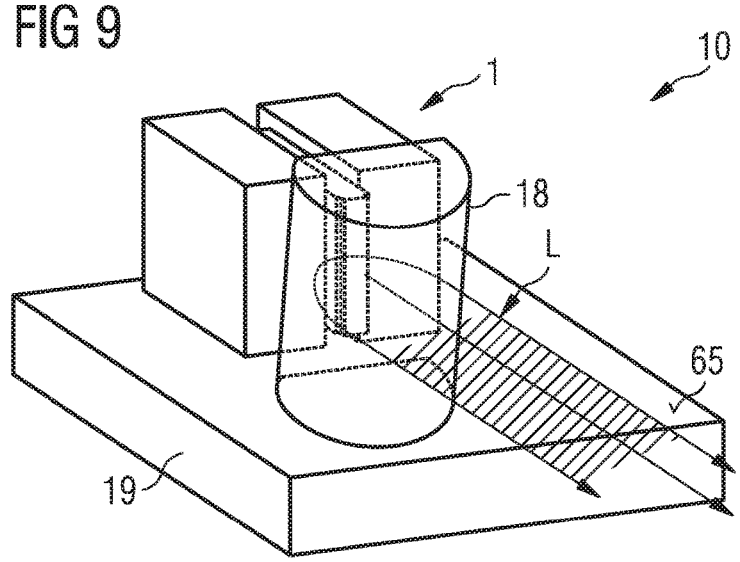

In the exemplary embodiment of the semiconductor laser arrangement 10 as shown in FIG. 9, a lens 18 is mounted on the mounting support 19 in a stationary manner. The lens 18 is a cylindrical lens. Such a lens 18 is preferably also present in all other exemplary embodiments of the arrangement 10. Beam focusing along a direction of high divergence of the laser radiation L is provided via the lens 18. In other words, the lens 18 is used for a so-called fast-axis collimation.

Since the so-called fast axis, for example the direction of a relatively large beam divergence, is oriented in FIG. 9 parallel to the mounting plane 65, the lens 18 can be mounted upright. Precise positioning of the lens 18 in the direction perpendicular to the mounting plane 65 is thus not necessary.

In FIG. 10, modifications of the arrangements are shown. According to FIGS. 10A to 10D, the semiconductor layer sequence is arranged parallel to the mounting plane so that the growth direction is oriented perpendicular to the mounting plane. In order to ensure a sufficient distance between the active zone and the mounting support 19, in addition a base 15 is required, see in particular FIG. 10A. Due to the base 15, which is made of copper, for example, additional assembly tolerances occur in the direction perpendicular to the mounting plane 65. Such a base is not required in the exemplary embodiment illustrated above. In addition, the lens is mounted horizontally, which makes precise positioning difficult due to a lack of smooth gripping surfaces and bearing surfaces.

Furthermore, in the arrangements of FIGS. 10B to 10D the semiconductor lasers are electrically contacted via bonding wires 14. In contrast, a simpler surface mounting, also referred to as SMT, is achieved via the contact areas in the above exemplary embodiments without bonding wires and having a lower thermal resistance.

The priority of German patent application 10 2015 116 968.1 is claimed, which is hereby incorporated by reference.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

LIST OF REFERENCE SIGNS

1 semiconductor laser
14 bonding wire
15 base
16 conductor track
17 solder
18 lens
19 mounting support
2 semiconductor layer sequence
20 growth substrate
21 p-conducting region
22 active zone
23 n-conducting region
25 facet
3 resonator line
32 trench
33 ridge waveguide
41 electric p-contact
43 electric n-contact
61 external electric p-contact area
63 external electric n-contact area
64 contact metallization
65 mounting plane
66 metallic base layer
71 electrical insulation
81 casting body
9 temporary intermediate carrier
10 semiconductor laser arrangement
G growth direction of the semiconductor layer sequence
L laser radiation
M coating material
R rounding
S separation line
W1 diameter of the n-contact
W2 diameter of the electrical insulation

The invention claimed is:

1. A semiconductor laser comprising
   a semiconductor layer sequence, which has an n-conducting region, a p-conducting region and an active zone therebetween,
   at least one resonator line in which, during operation of the semiconductor laser, a laser radiation is generated and which is oriented parallel to the active zone,
   an electric p-contact which is located on the p-conducting region and which is set directly into the p-conducting region for impressing current,
   an electric n-contact which is located on the n-conducting region and which is set directly into the n-conducting region for impressing current, and
   a p-contact area, which is electrically connected to the p-contact, and an n-contact area which is electrically connected to the n-contact, so that the p-contact area and the n-contact area are located in a common mounting plane and, in the mounting plane, are set up for an external electrical and mechanical connection of the semiconductor laser and, with a tolerance of at most 15°, parts of the p-contact area and of the n-contact area which are located in the common mounting plane are oriented parallel to a growth direction of the semiconductor layer sequence so that the semiconductor layer sequence stands upright on the mounting plane,
   wherein the semiconductor laser can be surface-mounted in a wire-free manner.

2. The semiconductor laser according to claim 1, in which the resonator line and the growth direction are oriented parallel to the parts of the contact areas which are located in the common mounting plane, with a tolerance of at most 2°,
   wherein a distance between the resonator line and the mounting plane is between 40 μm and 0.6 mm inclusive.

3. The semiconductor laser according to claim 1,
   in which the n-contact extends from the p-conducting region through the active zone into the n-conducting region and, viewed in a plan view, is located next to the resonator line.

4. The semiconductor laser according to claim 3, in which, in at least one cross section parallel to the active zone, the n-contact or the p-contact is surrounded all around by a material of the semiconductor layer sequence, wherein the n-contact and the p-contact each consist of one or more metals, and wherein the n-contact ends within the n-conducting region.

5. The semiconductor laser according to claim 1,
   in which all the contact areas are located on the same side of the semiconductor layer sequence, wherein the contact areas are each arranged directly on the associated contact.

6. The semiconductor laser according to claim 1, in which the p-contact area is located on a different side of the semiconductor layer sequence than the n-contact area, so that the resonator line is arranged at least partially between the contact areas.

7. The semiconductor laser according to claim 6, in which the p-contact is guided completely through the semiconductor layer sequence.

8. The semiconductor laser according to claim 1, which further comprises a ridge waveguide through which the resonator line is defined, wherein current is impressed from the p-contact only on the ridge waveguide into the semiconductor layer sequence, and wherein the ridge waveguide is limited on both sides by trenches in the semiconductor layer sequence and the trenches are at least partially filled with the p-contact.

9. The semiconductor laser according to claim 1, in which the parts of the contact areas located in the mounting plane run along a straight line parallel to the resonator line and, viewed in a plan view, are arranged next to the resonator line.

10. The semiconductor laser according to claim 1, in which one of the contact areas, in a plan view of the semiconductor layer sequence, is L-shaped and the other of the contact areas is located in a space between legs of the L.

11. The semiconductor laser according to claim 1, in which the contact areas have a convex rounding which points in the direction towards the semiconductor layer sequence and which is restricted to the contact areas.

12. The semiconductor laser according to claim 1, in which the semiconductor layer sequence, seen in plan view, is surrounded all around by a casting body, and the casting body is formed from a plastic, wherein a thickness of the casting body is equal to a thickness of the semiconductor layer sequence together with a growth substrate, with a tolerance of at most 3 µm.

13. The semiconductor laser according to claim 12, in which the casting body, in the direction parallel to the active zone, extends over the contact areas and the semiconductor layer sequence all around with a width of at least 5 µm and at most 50 µm.

14. The semiconductor laser according to claim 1, in which a thickness of the contact areas, in the direction perpendicular to the active zone, is between 40 µm and 0.6 mm inclusive, wherein the p-contact, the n-contact and the contact areas are set back relative to facets of the semiconductor layer sequence, wherein the resonator line runs perpendicular to mutually opposite facets and the facets constitute resonator end faces of the resonator line and are oriented perpendicular to the mounting plane.

15. A semiconductor laser arrangement comprising at least one semiconductor laser according to claim 1, a mounting support on which the semiconductor laser is fastened with the p-contact area and the n-contact area, and a lens which is mounted directly on the mounting support and which is arranged optically directly downstream of the semiconductor laser.

16. A semiconductor laser comprising a semiconductor layer sequence, which has an n-conducting region, a p-conducting region and an active zone therebetween, at least one resonator line in which, during operation of the semiconductor laser, a laser radiation is generated and which is oriented parallel to the active zone, an electric p-contact which is located on the p-conducting region and which is set directly into the p-conducting region for impressing current, an electric n-contact which is located on the n-conducting region and which is set directly into the n-conducting region for impressing current, and a p-contact area, which is electrically connected to the p-contact, and an n-contact area which is electrically connected to the n-contact, so that the p-contact area and the n-contact area are set up for an external electrical and mechanical connection of the semiconductor laser and, with a tolerance of at most 45°, are oriented partially or completely parallel to a growth direction of the semiconductor layer sequence, wherein the semiconductor laser can be surface-mounted in a wire-free manner.

* * * * *